United States Patent
Rosca

(10) Patent No.: US 8,698,556 B2
(45) Date of Patent: Apr. 15, 2014

(54) LOW SWITCHING ERROR, SMALL CAPACITORS, AUTO-ZERO OFFSET BUFFER AMPLIFIER

(75) Inventor: Gabriel Rosca, Ploiesti (RO)

(73) Assignee: Microchip Technology Incorporated, Chandler, AZ (US)

( * ) Notice: Subject to any disclaimer, the term of this patent is extended or adjusted under 35 U.S.C. 154(b) by 70 days.

(21) Appl. No.: 13/413,599

(22) Filed: Mar. 6, 2012

(65) Prior Publication Data

US 2012/0249243 A1 Oct. 4, 2012

Related U.S. Application Data

(60) Provisional application No. 61/469,472, filed on Mar. 30, 2011.

(51) Int. Cl.
*H03F 1/14* (2006.01)
*H03F 1/02* (2006.01)
*H03F 3/72* (2006.01)

(52) U.S. Cl.
CPC ........................... *H03F 3/72* (2013.01)
USPC .................................. 330/51; 330/9

(58) Field of Classification Search
USPC ........................... 330/9, 51; 327/124
See application file for complete search history.

(56) References Cited

U.S. PATENT DOCUMENTS

| | | | | |
|---|---|---|---|---|
| 4,931,745 A | | 6/1990 | Goff et al. | 330/9 |
| 5,115,202 A | | 5/1992 | Brown | 330/9 |
| 5,486,788 A | * | 1/1996 | Schlager et al. | 330/9 |
| 6,130,578 A | | 10/2000 | Tang | 330/9 |

OTHER PUBLICATIONS

International PCT Search Report and Written Opinion, PCT/US2012/029734, 8 pages.

* cited by examiner

*Primary Examiner* — Robert Pascal
*Assistant Examiner* — Khiem Nguyen
(74) *Attorney, Agent, or Firm* — King & Spalding L.L.P.

(57) ABSTRACT

Switching error in an auto-zero offset amplifier is reduced by keeping a clock level to the auto-zero switches at an amplitude just enough to insure complete switching of the switches of the auto-zero offset buffer amplifier. A level shifting circuit provides the clock at the desired level control and a local voltage regulator provides a regulated voltage to the level shifting circuit.

18 Claims, 3 Drawing Sheets

LOW SWITCHING ERROR, SMALL CAPACITORS, AUTO-ZERO OFFSET BUFFER AMPLIFIER

RELATED PATENT APPLICATION

This application claims priority to commonly owned U.S. Provisional Patent Application Ser. No. 61/469,472; filed Mar. 30, 2011; entitled "Low Switching Error, Small Capacitors, Auto-Zero Offset Buffer," by Gabriel Rosca; which is hereby incorporated by reference herein for all purposes.

TECHNICAL FIELD

The present disclosure relates to buffer amplifiers, and, more particularly, to auto-zero offset buffer amplifiers.

BACKGROUND

Auto-zero offset operational (buffer) amplifiers are a class of analog circuits that combine analog and digital (switching) circuitry resulting in very low input-referred DC offset and noise. These operational amplifiers are often used in precision applications where high gain is necessary to resolve very small voltages. Examples include RTD, thermocouple, resistive current measurement and other sensing applications. The use of an auto-zero offset operational amplifier may relax the accuracy requirements of the A/D converter, saving cost. Today's auto-zero offset operational amplifiers bear little resemblance to the early chopping schemes that were used to reduce the average offsets. Those circuits were very simple using discrete amplifiers and switches to chop the amplifier's inputs and outputs using a clock. Heavy filtering was required to achieve low offset, and filter out the switching noise. Chopper amplifiers had a low frequency bandwidth, usually a few Hertz, limited by the large settling time constants.

Referring to FIG. 1, depicted is a schematic block diagram of a prior art auto-zero offset operational amplifier. The prior art auto-zero offset operational amplifier, generally represented by the numeral 100, may comprise at least two amplifiers 102 and 104 that are combined to generate the final signal output, Vout. A conventional wide bandwidth "main" amplifier 102 is connected directly from input to output and continuously processes the incoming signal. A second, very high gain "nulling" amplifier 104 is connected in parallel for offset correction. The nulling amplifier 104 is zeroed to null its own offset and to eliminate low frequency 1/f noise below the clock frequency of the clock oscillator 110. Zeroing involves shorting together the two inputs of the amplifier 104 with switch 108 and storing the resulting offset onto a capacitor 112. During a compensation cycle, this correction voltage is applied to the nulling amplifier 104 through an auxiliary port 116. The correction voltage is held on a main amplifier auxiliary port 118 by a storage capacitor 114 when the nulling amplifier 104 is disconnected by switch 106 from the main amplifier 102 during its zeroing cycle. This correction voltage is then used to null the offset of the main amplifier 102 through its auxiliary port 118.

Early auto-zero offset amplifiers combined a wideband "main" amplifier and a single "nulling" amplifier. The single nulling amplifier has a sample and hold to correct its own offset, and to reduce the offset of the main amplifier. Early implementations required external capacitors and had sampling frequencies of a few hundred Hertz. Great improvements have been made in the state of the art over the years. Modern auto-zero offset operational amplifiers are now able to achieve DC offsets of a few microvolts with very low temperature drift.

However, due to the internal clock switching in the nulling amplifier, some switching noise will appear at the output. This will be most predominant around the sampling clock frequency. If this noise is not symmetric, i.e., generating substantially equal amounts of positive and negative glitches, an average DC offset may result in the system. Therefore, reduction of these glitches is essential for good DC performance.

An auto-zero offset buffer amplifier having too small auto-zero capacitance develops high switching errors. In order to reduce the switching errors to a smaller value, higher value capacitance (larger area capacitors) are required in the auto-zero circuit. However, increasing the capacitance requires more integrated circuit silicon area for the capacitors. For example, with a specific requirement of +/−5 mV maximum switching errors, the capacitors would be ten (10) times larger and the overall module on the integrated circuit die would be at least two times bigger.

SUMMARY

Therefore a need exists for a technique and circuit for providing low switching error using small capacitors by controlling the switching clock's amplitude.

According to an embodiment, an auto-zero offset buffer amplifier may comprise: a main amplifier having differential inputs, an auxiliary nulling input and an output; a nulling amplifier having differential inputs, an auxiliary nulling input and an output; a first field effect transistor (FET) switch coupled to the differential inputs of the main and nulling amplifiers; a second FET switch coupled to the output of the nulling amplifier and the auxiliary nulling inputs of the main and nulling amplifiers; a first storage capacitor coupled to the second FET switch and the auxiliary nulling input of the nulling amplifier; a second storage capacitor coupled to the second FET switch and the auxiliary nulling input of the main amplifier; an oscillator having a clock output; a level shifting circuit having an input coupled to the clock output of the oscillator and an output coupled to and controlling the first and second switches; and a voltage regulator coupled to the level shifting circuit; the level shifting circuit provides a control signal to the first and second FET switches, wherein the control signal has a voltage amplitude that is slightly greater than a gate-source turn-on voltage of the first and second FET switches.

According to a further embodiment, the voltage regulator may comprise: an error amplifier; a feedback network coupled to a first input and an output of the error amplifier; and a voltage reference coupled to a second input of the error amplifier; wherein the voltage regulator provides a voltage that is slightly higher then is required to fully turn on the first and second FET switches. According to a further embodiment, the level shifting circuit allows a difference in potential between an analog ground and a digital ground. According to a further embodiment, the main amplifier further comprises a buffer amplifier to increase available output current. According to a further embodiment, the first and second FET switches are single pole double throw FET switches.

According to a further embodiment, each of the first and second FET switches may comprise: a first n-channel FET; a second n-channel FET; a first p-channel FET; and a second p-channel FET; wherein gates of the first p-channel FET and the second n-channel FET are coupled to the control signal from the level shifting circuit, gates of the second p-channel FET and the first n-channel FET are coupled to an inverted control signal from the level shifting circuit, a drain of the first p-channel FET and a source of the first n-channel FET are coupled to a common node; a source of the first p-channel FET and a drain of the first n-channel FET are coupled to a normally closed node; and a source of the second p-channel FET and a drain of the second n-channel FET are coupled to a normally open node.

According to a further embodiment, n-wells of the first and second p-channel FETs are coupled to an analog voltage source, and p-wells of the first and second n-channel FETs are coupled to a common of the analog voltage source. According to a further embodiment, an n-substrate is coupled to the common of the analog voltage source. According to a further embodiment, the common of the analog voltage source is at substantially ground potential.

According to another embodiment, a method for auto-zero offset correction in a buffer amplifier may comprise the steps of: providing a main amplifier having differential inputs, an auxiliary nulling input and an output; providing a nulling amplifier having differential inputs, an auxiliary nulling input and an output; providing a first field effect transistor (FET) switch coupled to the differential inputs of the main and nulling amplifiers; providing a second FET switch coupled to the output of the nulling amplifier and the auxiliary nulling inputs of the main and nulling amplifiers; providing a first storage capacitor coupled to the second FET switch and the auxiliary nulling input of the nulling amplifier; providing a second storage capacitor coupled to the second FET switch and the auxiliary nulling input of the main amplifier; providing a clock output from an oscillator; controlling the first and second switches with a level shifting circuit having an input coupled to the clock output of the oscillator; and coupling a voltage regulator to the level shifting circuit; and providing a control signal from the level shifting circuit to the first and second FET switches that has a voltage amplitude slightly greater than a gate-source turn-on voltage of the first and second FET switches.

According to a further embodiment of the method, the voltage regulator may comprise the step of providing a slightly higher voltage to the level shifting circuit then is required to fully turn on the first and second FET switches. According to a further embodiment of the method, the step of reducing switching offset compensation error may comprise the step of increasing capacitance values of the first and the second storage capacitors. According to a further embodiment of the method, the voltage regulator may comprise: an error amplifier; a feedback network coupled to a first input and an output of the error amplifier; and a voltage reference coupled to a second input of the error amplifier; wherein the voltage regulator provides a voltage that is slightly higher then is required to fully turn on the first and second FET switches.

According to a further embodiment of the method, the level shifting circuit allows a difference in potential between an analog ground and a digital ground. According to a further embodiment of the method, the main amplifier further comprises a buffer amplifier to increase available output current. According to a further embodiment of the method, the first and second FET switches may be single pole double throw FET switches. According to a further embodiment of the method, n-wells of the first and second p-channel FETs are coupled to an analog voltage source; and p-wells of the first and second n-channel FETs are coupled to a common of the analog voltage source. According to a further embodiment of the method, an n-substrate is coupled to a common of an analog voltage source.

BRIEF DESCRIPTION OF THE DRAWINGS

A more complete understanding of the present disclosure may be acquired by referring to the following description taken in conjunction with the accompanying drawings wherein.

Figure 1:
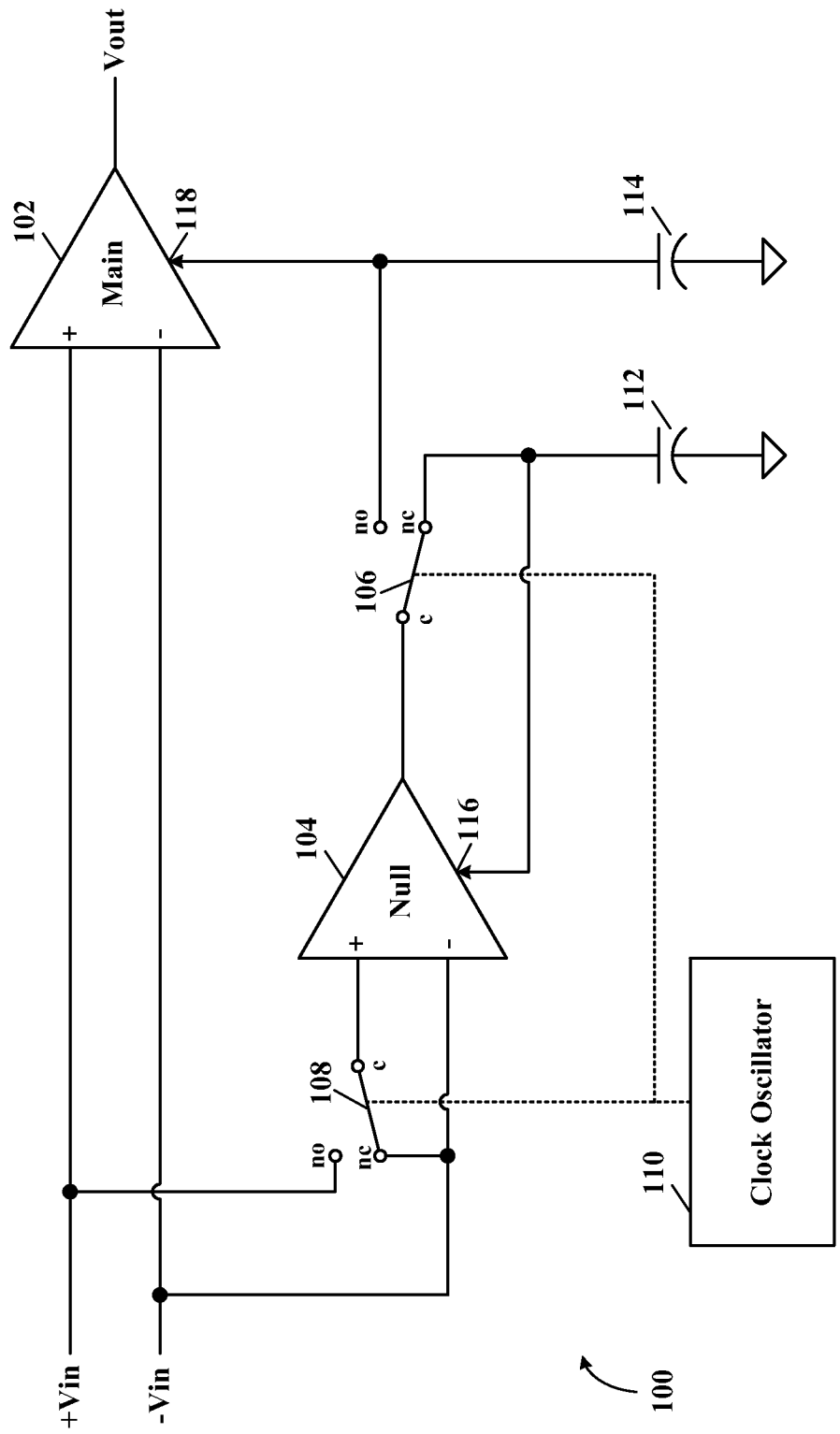
FIG. 1 illustrates a schematic diagram of a prior art auto-zero offset operational amplifier.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Switching error in an auto-zero offset amplifier is inversely proportional to the capacitance and directly proportional to the difference between the high and low clock voltage levels which introduce transients that create dynamic error only reducible by increasing the capacitance. Therefore, by reducing the switching clock's amplitude instead of increasing the area of the switched capacitors, acceptably low switching error caused by static and dynamic components without prohibitory increase the amount of capacitance needed in the absence of the clock amplitude control (the same effect would be achieved by increasing the capacitance by many times (~10x). Even better switching error is possible by increasing the capacitance (increased area) of the switched capacitors and limiting the switching clock's amplitude. By using a level shifting circuit for the clock control to the auto zero switches and a local voltage regulator supplying a regulated voltage to the level shifting circuit, the clock amplitude may be kept at the lowest level that ensures complete switching (source-drain resistance at a minimum, e.g., transistor in linear operation mode—ON state) of the switching devices of the auto-zero offset buffer amplifier. The switching devices are field effect transistor (FET) based and the purpose of the local regulator and its control loop is to ensure that these FET switches are getting appropriate voltage levels all of the time so as to perform optimally in the operation of the auto-zero offset amplifier.

Figure 2:
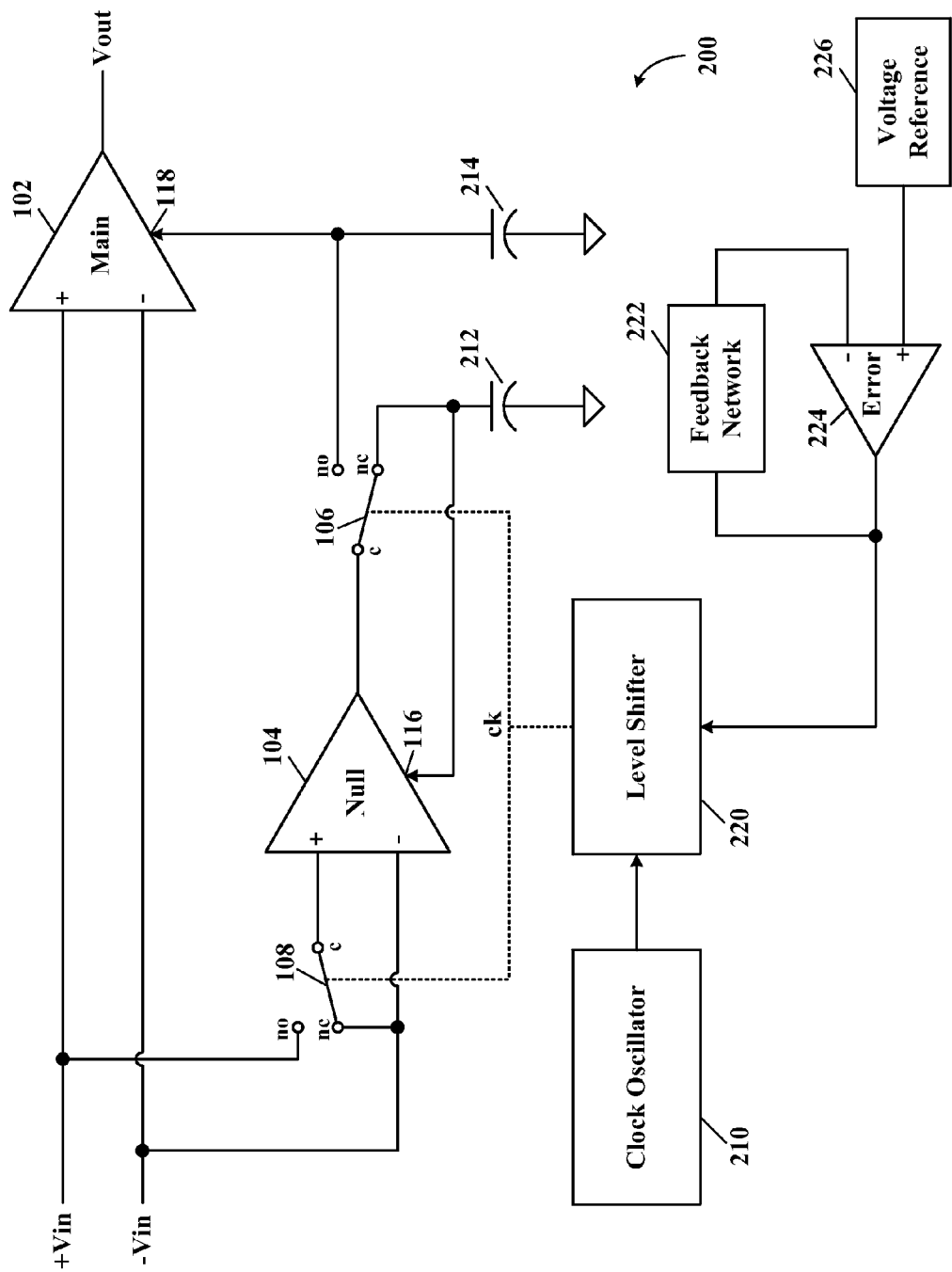
FIG. 2 illustrates a schematic diagram of an auto-zero offset operational amplifier having a clock level shifting circuit and a voltage regulator coupled to the level shifting circuit, according to a specific example embodiment of this disclosure.
Figure 3:
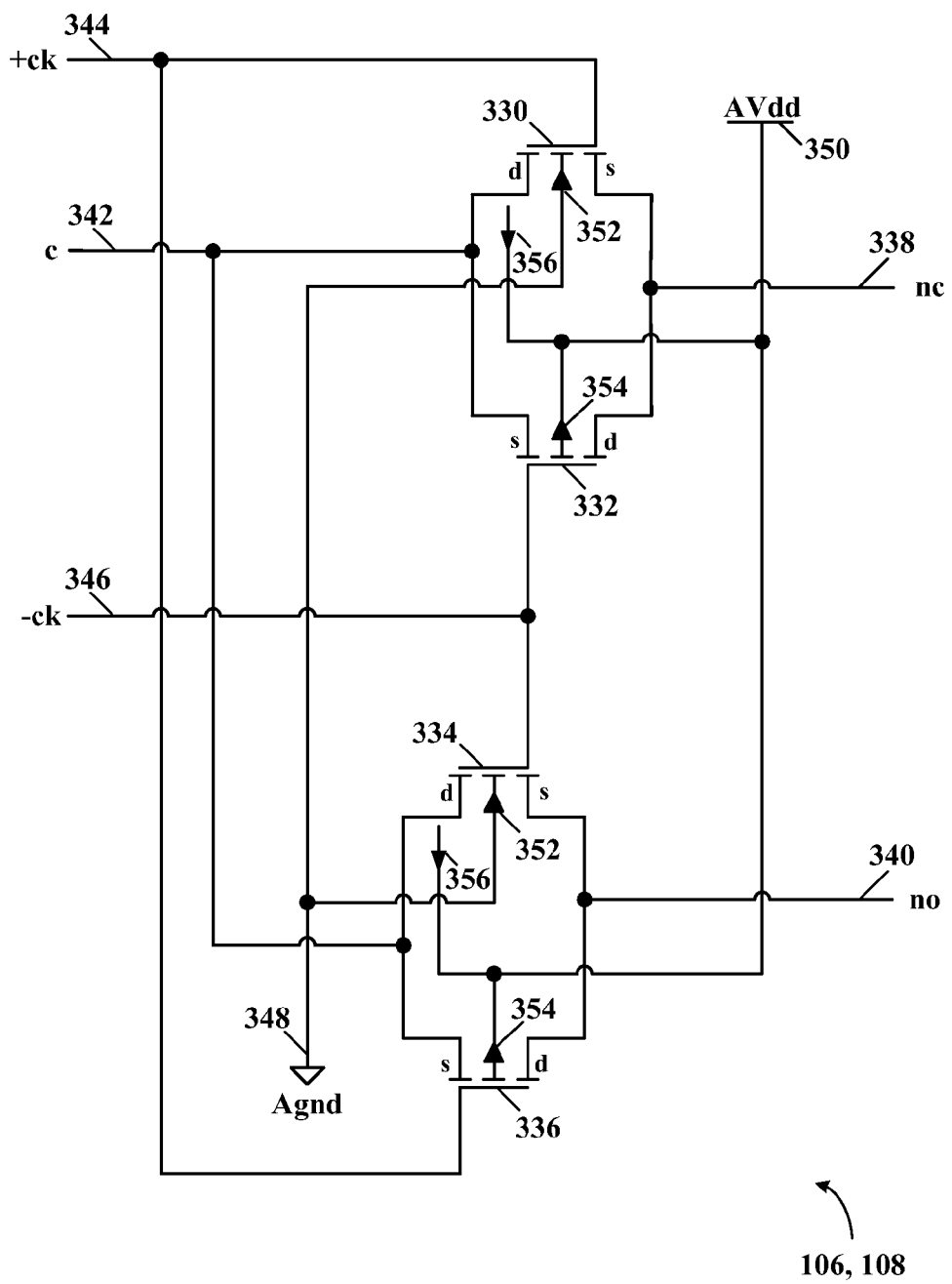
FIG. 3 illustrates a schematic diagram of single pole double throw switches used in the auto-zero offset operational amplifier, according to the teachings of this disclosure.

Referring to FIG. 2, depicted is a schematic diagram of an auto-zero offset operational amplifier having a clock level shifting circuit and a voltage regulator coupled to the level shifting circuit, according to a specific example embodiment of this disclosure. An auto-zero offset amplifier, generally represented by the numeral 200, may comprise at least two amplifiers 102 and 104 that are combined to generate the final signal output, Vout. A conventional wide bandwidth "main" amplifier 102 is connected directly from input to output and continuously processes the incoming signal. A second, very high gain "nulling" amplifier 104 is connected in parallel for offset correction. The nulling amplifier 104 is zeroed to null its own offset and to eliminate low frequency 1/f noise below the clock frequency of the clock oscillator 110. Zeroing involves shorting together the two inputs of the amplifier 104 with switch 108 and storing the resulting offset onto a capacitor 212. During a compensation cycle, this correction voltage is applied to the nulling amplifier 104 through an auxiliary port 116. The correction voltage is held on a main amplifier auxiliary port 118 by a storage capacitor 214 when the nulling amplifier 104 is disconnected by switch 106 from the main amplifier 102 during its zeroing cycle. This correction voltage is then used to null the offset of the main amplifier 102 through its auxiliary port 118. A buffer amplifier may be incorporated with the main amplifier 102 to provide higher output current capability. The switches 106 and 108 are comprised of re-channel and p-channel FET switches as shown in FIG. 3 and more fully described hereinafter.

The capacitors 212 and 214 may be smaller than the capacitors 112 and 114 of FIG. 1 to achieve the same switching error by using a level shifting circuit 220 in combination with a local voltage regulator comprising an error amplifier 224, a feedback network 222 and a voltage reference 226. The local voltage regulator (error amplifier 224 and feedback network 222) provides a low voltage to the level shifting circuit 220. Regardless of what the amplitude of the clock from the clock oscillator 210 may be, at the output of the level shifting circuit 220 the amplitude of the clock, ck, will be limited to such a value that is just enough to properly switch the FET switches 106 and 108 (see FIG. 3) of the auto-zero offset buffer amplifier 200.

The level shifting circuit 220 provides an adaptive amplitude clock that goes up or down following the Vgs of a n-channel transistor as used in the FET switches 106 and 108. The error amplifier 224 of the voltage regulator is intentionally unbalanced to insure a slightly higher voltage then is required to fully turn on (drain-source at minimal resistance) the n-channel portion of the FET switch. The level shifting circuit 220 may also allow a difference in voltage potential between the analog ground and the digital ground, e.g., analog domain and digital domain, respectively, of which the clock oscillator and a control portion of the switches 106 and 108 are coupled thereto. A more detailed description of level shifting between different voltage domains of an integrated circuit may be found in commonly owned U.S. Pat. No. 7,852,118 B2, incorporated by reference herein for all purposes.

Using this technique and circuit greatly enhances the performance of the auto-zero offset buffer amplifier while keeping the silicon area thereof at a reasonable level. The resulting switching error is thus brought within a desired range without the need to make the offset zero storage capacitors bigger. A 50% silicon area economy may be obtained while the performance of the circuit is maintained. In addition by using this circuit, if the capacitance area is unchanged (not reduced) then the switching errors may be decreased by a factor of about eight (8).

Referring to FIG. 3, depicted is a schematic diagram of the single pole double throw switches used in the auto-zero offset operational amplifier, according to the teachings of this disclosure. Each of the switches 106 and 108 are comprised of two n-channel FETs 330 and 334, and two p-channel FETs 332 and 336 coupled together as shown in FIG. 3. The n-wells 354 of the p-channel FETs 332 and 336 are coupled to the analog source voltage, AVdd, the p-wells 352 of the n-channel FETs 330 and 334 are coupled to the common (ground), Agnd, of the analog source voltage, and the n-substrate 356 is coupled to the analog source voltage, AVdd. The switch common (c) node 342 is coupled to the drains of the p-channel FETs 332 and 336, and the sources of the n-channel FETs 330 and 334. The normally open (no) node 340 is coupled to the source of FET 334 and the drain of FET 336. The normally closed (nc) node 338 is coupled to the source of FET 330 and the drain of FET 332. The clock output, ck, from the level shifting circuit 220 is applied to the gates of the FETs 330 and 336 (+ck), and the inverted clock output (−ck) is applied to the gates of FETs 334 and 336. Thus as the clock, ck, changes logic levels so does connection of the common (c) node 342 to either the normally open (no) node 340 or the normally closed (nc) node 338. The amplitude of the clock, ck, is level shifted and maintained at just enough of a voltage amplitude to be slightly greater than Vgs of the active FET switch pair to insure saturation thereof (minimum resistance between the source and drain of each).

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An auto-zero offset buffer amplifier, comprising:
   a main amplifier having differential inputs, an auxiliary nulling input and an output;
   a nulling amplifier having differential inputs, an auxiliary nulling input and an output;
   a first field effect transistor (FET) switch coupled to the differential inputs of the main and nulling amplifiers;
   a second FET switch coupled to the output of the nulling amplifier and the auxiliary nulling inputs of the main and nulling amplifiers;
   a first storage capacitor coupled to the second FET switch and the auxiliary nulling input of the nulling amplifier;
   a second storage capacitor coupled to the second FET switch and the auxiliary nulling input of the main amplifier;
   an oscillator having a clock output;
   a level shifting circuit having an input coupled to the clock output of the oscillator and an output coupled to and controlling the first and second switches; and
   a voltage regulator coupled to the level shifting circuit;
   the level shifting circuit provides a control signal to the first and second FET switches, wherein the control signal has a voltage amplitude that is slightly greater than a gate-source turn-on voltage of the first and second FET switches.

2. The auto-zero offset buffer amplifier according to claim 1, wherein the voltage regulator comprises:
   an error amplifier;
   a feedback network coupled to a first input and an output of the error amplifier; and
   a voltage reference coupled to a second input of the error amplifier;
   wherein the voltage regulator provides a voltage that is slightly higher then is required to fully turn on the first and second FET switches.

3. The auto-zero offset buffer amplifier according to claim 1, wherein the level shifting circuit allows a difference in potential between an analog ground and a digital ground.

4. The auto-zero offset buffer amplifier according to claim 1, wherein the main amplifier further comprises a buffer amplifier to increase available output current.

5. The auto-zero offset buffer amplifier according to claim 1, wherein the first and second FET switches are single pole double throw FET switches.

6. The auto-zero offset buffer amplifier according to claim 5, wherein each of the first and second FET switches comprises:
   a first n-channel FET;
   a second n-channel FET;
   a first p-channel FET; and
   a second p-channel FET;
   wherein
   gates of the first n-channel FET and the second p-channel FET are coupled to the control signal from the level shifting circuit,
   gates of the second n-channel FET and the first p-channel FET are coupled to an inverted control signal from the level shifting circuit,
   a drain of the first n-channel FET and a source of the first p-channel FET are coupled to a common node;
   a source of the first n-channel FET and a drain of the first p-channel FET are coupled to a normally closed node; and
   a source of the second n-channel FET and a drain of the second p-channel FET are coupled to a normally open node.

7. The auto-zero offset buffer amplifier according to claim 6, wherein n-wells of the first and second p-channel FETs are coupled to an analog voltage source, and p-wells of the first and second n-channel FETs are coupled to a common of the analog voltage source.

8. The auto-zero offset buffer amplifier according to claim 7, an n-substrate is coupled to the analog voltage source.

9. The auto-zero offset buffer amplifier according to claim 7, wherein the common of the analog voltage source is at substantially ground potential.

10. A method for auto-zero offset correction in a buffer amplifier, said method comprising the steps of:
   providing a main amplifier having differential inputs, an auxiliary nulling input and an output;
   providing a nulling amplifier having differential inputs, an auxiliary nulling input and an output;
   providing a first field effect transistor (FET) switch coupled to the differential inputs of the main and nulling amplifiers;
   providing a second FET switch coupled to the output of the nulling amplifier and the auxiliary nulling inputs of the main and nulling amplifiers;
   providing a first storage capacitor coupled to the second FET switch and the auxiliary nulling input of the nulling amplifier;
   providing a second storage capacitor coupled to the second FET switch and the auxiliary nulling input of the main amplifier;
   providing a clock output from an oscillator;
   controlling the first and second switches with a level shifting circuit having an input coupled to the clock output of the oscillator; and
   coupling a voltage regulator to the level shifting circuit; and
   providing a control signal from the level shifting circuit to the first and second FET switches that has a voltage amplitude slightly greater than a gate-source turn-on voltage of the first and second FET switches.

11. The method according to claim 10, wherein the voltage regulator comprises is unbalanced to provide a slightly higher voltage to the level shifting circuit then is required to fully turn on the first and second FET switches.

12. The method according to claim 10, further comprising the step of reducing switching offset compensation error by increasing capacitance values of the first and the second storage capacitors.

13. The method according to claim 10, wherein the voltage regulator comprises:
   an error amplifier;
   a feedback network coupled to a first input and an output of the error amplifier; and
   a voltage reference coupled to a second input of the error amplifier;
   wherein the voltage regulator provides a voltage that is slightly higher than is required to fully turn on the first and second FET switches.

14. The method according to claim 10, wherein the level shifting circuit allows a difference in potential between an analog ground and a digital ground.

15. The method according to claim 10, wherein the main amplifier further comprises a buffer amplifier to increase available output current.

16. The method according to claim 10, wherein the first and second FET switches are single pole double throw FET switches.

17. The method according to claim 10, further comprising the steps of:
   coupling n-wells of the first and second p-channel FETs to an analog voltage source; and
   coupling p-wells of the first and second n-channel FETs to a common of the analog voltage source.

18. The method according to claim 17, further comprising the step of coupling an n-substrate to the analog voltage source.

* * * * *